United States Patent
Ma et al.

(10) Patent No.: US 10,288,930 B2
(45) Date of Patent: May 14, 2019

(54) DISPLAY PANEL AND DISPLAY DEVICE

(71) Applicant: BOE TECHNOLOGY GROUP CO., LTD., Beijing (CN)

(72) Inventors: Yongda Ma, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/544,924

(22) PCT Filed: Feb. 7, 2017

(86) PCT No.: PCT/CN2017/073059
§ 371 (c)(1),
(2) Date: Jul. 20, 2017

(87) PCT Pub. No.: WO2017/193654
PCT Pub. Date: Nov. 16, 2017

(65) Prior Publication Data
US 2018/0217442 A1    Aug. 2, 2018

(30) Foreign Application Priority Data

May 12, 2016 (CN) .............. 2016 2 0429180 U

(51) Int. Cl.
*G02F 1/1345* (2006.01)
*G02F 1/1335* (2006.01)
(Continued)

(52) U.S. Cl.
CPC ...... *G02F 1/133528* (2013.01); *G02F 1/1333* (2013.01); *G02F 1/1339* (2013.01);
(Continued)

(58) Field of Classification Search
CPC ................ G02F 1/13452; G02F 2001/133317
See application file for complete search history.

(56) References Cited

U.S. PATENT DOCUMENTS 5,838,412 A * 11/1998 Ueda .................... G02B 6/0088
349/150
6,515,721 B2    2/2003 Jin et al.
(Continued)

FOREIGN PATENT DOCUMENTS

CN            1949034 A      4/2007
CN          101551533 A     10/2009
(Continued)

OTHER PUBLICATIONS

Search Report for International Application No. PCT/CN2017/073059 dated May 3, 2016.

*Primary Examiner* — Kendrick Hsu
(74) *Attorney, Agent, or Firm* — Calfee, Halter & Griswold LLP

(57) ABSTRACT

A display panel includes a first substrate; a second substrate, a base plate and a chip. The second substrate comprises a region overlapping with the first substrate and a region not overlapping with the first substrate, and a region for mounting a chip is disposed in the non-overlapping region. The base plate is disposed within the chip mounting region and has a receiving portion. The chip is disposed within the receiving portion of the base plate and electrically connected to the second substrate.

19 Claims, 3 Drawing Sheets

(51) Int. Cl.
*G02F 1/1333* (2006.01)
*G02F 1/1339* (2006.01)
*H05K 1/18* (2006.01)
*H05K 1/14* (2006.01)
*H05K 3/28* (2006.01)

(52) U.S. Cl.
CPC ............... *G02F 1/13452* (2013.01); *G02F 2001/133317* (2013.01); *H05K 1/147* (2013.01); *H05K 1/189* (2013.01); *H05K 3/284* (2013.01); *H05K 2201/10136* (2013.01)

(56) References Cited

U.S. PATENT DOCUMENTS

| | | |
|---|---|---|
| 8,319,109 B2 | 11/2012 | Ishii |
| 2001/0010569 A1 | 8/2001 | Jin et al. |
| 2009/0250250 A1 | 10/2009 | Ishii |
| 2016/0190510 A1 | 6/2016 | Li |

FOREIGN PATENT DOCUMENTS

| | | |
|---|---|---|
| CN | 104460092 A | 3/2015 |
| CN | 105225608 A | 1/2016 |
| CN | 205594261 U | 9/2016 |
| TW | I1240112 B | 9/2005 |

\* cited by examiner

DISPLAY PANEL AND DISPLAY DEVICE

CROSS REFERENCE

The present application is based on International Application No. PCT/CN2017/073059, filed on Feb. 7, 2017, which is based upon and claims priority to Chinese Patent Application No. 201620429180.X, filed on May 12, 2016, and the entire contents thereof are incorporated herein by reference.

TECHNICAL FIELD

The present disclosure relates to the field of liquid display technology, and more particularly to a display panel and a display device.

BACKGROUND

A display panel generally includes a region for mounting a chip. In the preparation of the display panel, the chip in the chip mounting region is subject to the movement or damage under a force, so as to infect the display function of the display panel.

SUMMARY

In order to at least partly solve the technical problem existing in the related art, embodiments of the present disclosure provide a display panel and a display device.

According to an embodiment of the present disclosure, there is provided a display panel, including: a first substrate; a second substrate, including a region overlapping with the first substrate and a region non-overlapping with the first substrate, a region for mounting a chip is disposed in the non-overlapping region; a base plate, disposed within the chip mounting region and having a receiving portion; and a chip, disposed within the receiving portion of the base plate and electrically connected to the second substrate.

According to an embodiment of the present disclosure, there is also provided a display panel, including a second substrate, a chip and a flexible circuit board, the flexible circuit board being disposed on the second substrate and electrically connected to the second substrate, and a region for mounting a chip being disposed on the flexible circuit board, the display panel further including: a base plate, disposed within the chip mounting region on the flexible circuit board and having a receiving portion, the chip being disposed within the receiving portion and electrically connected to the flexible circuit board.

According to an embodiment of the present disclosure, there is also provided a display device, including the above display panel provided by the embodiments of the present disclosure.

DETAILED DESCRIPTION

In order to provide a better understanding of the technical solution of the present disclosure by those skilled in the art, the display panel and the display device provided by the present disclosure will be described in detail with reference to the accompanying drawings.

First Embodiment

Figure 1A:
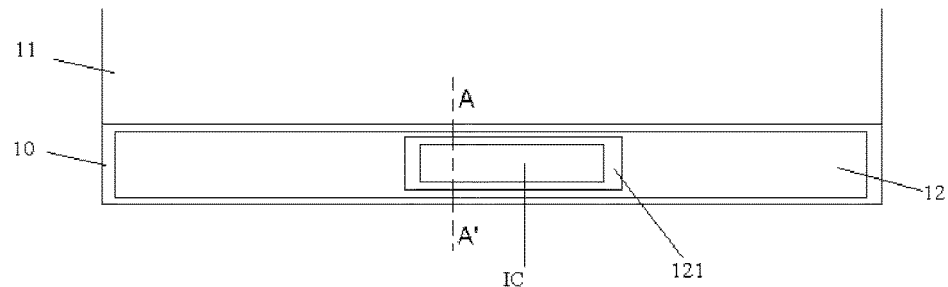
FIG. 1A is a top view of a display panel provided by a first embodiment of the present disclosure.
Figure 1B:
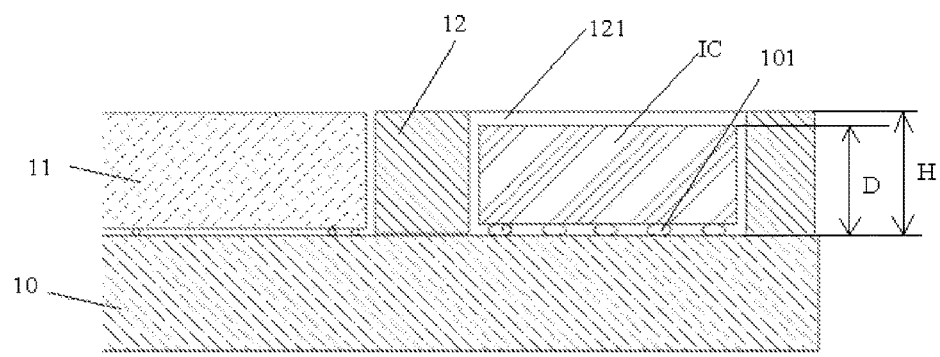
FIG. 1B is a cross sectional view along a line A-A' in FIG. 1A.

FIG. 1A is a top view of a display panel provided by a first embodiment of the present disclosure; and FIG. 1B is a cross sectional view along a line A-A' in FIG. 1A. Referring to FIGS. 1A and 1B, the display panel of the first embodiment includes a second substrate 10 (such as an array substrate), a first substrate 11 (such as a color film substrate) formed into a cell assembly with the second substrate 10, a chip IC and a base plate 12. The second substrate 10 includes a region overlapping with the first substrate 11 and a region which does not overlap with the first substrate 11. A chip mounting region is disposed in the non-overlapping region. The base plate 12 is disposed in the chip mounting region on the second substrate 10 and has a receiving portion 121. The receiving portion 121 is configured to receive the chip IC. That is, the chip IC is disposed within the receiving portion 121. Moreover, the chip IC is electrically connected to the second substrate 10 via an electric connection point 101. It should be noted that the second substrate 10 is not limited to an array substrate, and the first substrate 11 is not limited to a color film substrate. For example, the second substrate 10 may be a color film substrate and the first substrate 11 may be an array substrate.

It should be understood that, in the display panel provided in the present embodiment, by means of the base plate 12 having the receiving portion 121, it can mitigate or avoid the force that causes the chip IC to move or to be damaged during the assembling process of the display panel or the assembling process of the display device containing the display panel, so as to protect the chip and improve the quality of the display panel and the display device.

In the present embodiment, optionally, the upper surface (i.e. the surface away from the second substrate 10) of the base plate 12 is not lower than the upper surface (i.e. the surface away from the second substrate 10) of the chip IC. That is, a distance from the surface of the base plate 12 which is away from the second substrate 10 to the surface of the second substrate 10 which is proximate to the base plate 12 is not smaller than a distance from the surface of the chip IC which is away from the second substrate 10 to the surface of the second substrate 10 which is proximate to the chip IC. Specifically, referring to FIG. 1B, the receiving portion 121 of the base plate 12 is a through hole penetrating the base plate 12. The shape of the through hole is similar to the shape of the chip IC, and the size of the through hole is not smaller than the size of the chip IC. The chip IC is disposed within the through hole. The depth H (i.e. the thickness of the base plate 12) of the through hole (i.e. the receiving portion 121) is not smaller than the thickness D of the chip IC (including the thickness of the electric connection point 101), such that the chip IC is completely located within the receiving portion 121, to protect the chip IC. In this case, during the assembling process of the display panel and the display device, the base plate 12 can further protect the upper portion of the chip IC to from damaging. Moreover, the chip IC receives balanced force and even receives no force of vertical component while the bezels of the display panel and the display device are mounted. Therefore, no stress mark will be generated on the second substrate 10, and thus the display effect of the display panel and the display device will not be affected.

In one embodiment, the surface of the base plate 12 which is in contact with the second substrate 10 is a light reflective surface. Thus, it can avoid light leakage from the gap between the traces on the second substrate 10.

In the present embodiment, the base plate 12 may be made of (but not limited to) polycarbonate (i.e. PC material) or glass material.

Second Embodiment

Figure 2A:
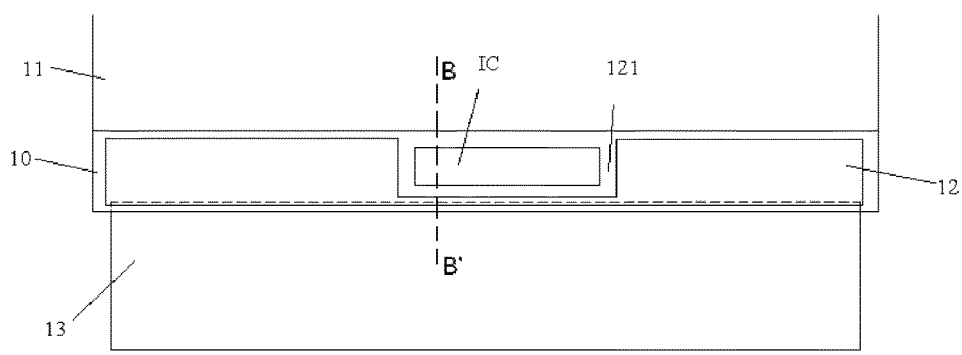
FIG. 2A is a top view of a display panel provided by a second embodiment of the present disclosure.
Figure 2B:
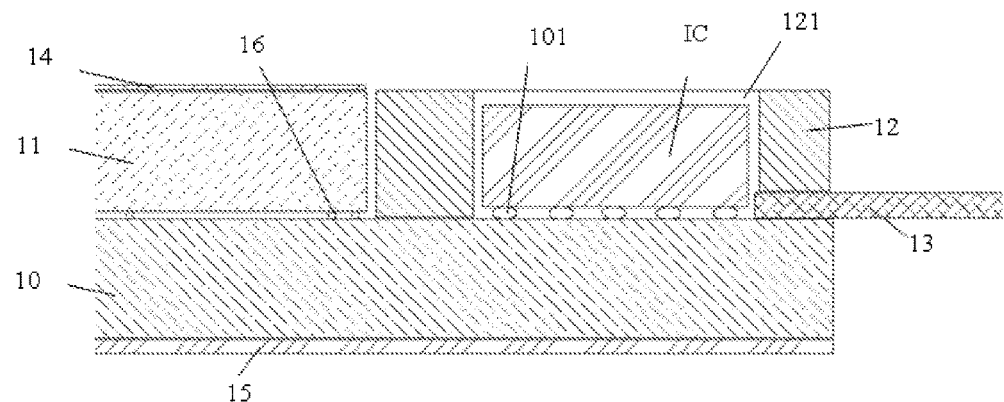
FIG. 2B is a cross sectional view along a line B-B' in FIG. 2A.

FIG. 2A is a top view of a display panel provided by a second embodiment of the present disclosure; and FIG. 2B is a cross sectional view along a line B-B' in FIG. 2A. Referring to FIGS. 2A and 2B, the display panel provided by the present embodiment is similar to the display panel provided by the first embodiment, and similarly includes: a second substrate 10, a first substrate 11, a base plate 12 and a chip IC. Since the structure of these components and position relationships between these components have been described in detail in the first embodiment, which will not be repeated herein.

In the following, only the differences between the present embodiment and the first embodiment will be described.

Specifically, in the present embodiment, the side (the upward side as shown in FIG. 2A) of the base plate 12 which is approximate to the display region of the display panel is disposed to have an opening. That is, the receiving portion 121 on the base plate 12 is an opening recess disposed on the side of the base plate 12 which is approximate to the display region of the display panel.

Moreover, in the present embodiment, the display panel also includes a flexible circuit board 13. A part of the flexible circuit board 13 is stacked below the base plate 12 (for example, below the side of the base plate 12 which is away from the display region of the display panel) and on the second substrate 10. The flexible circuit board 13 is electrically connected to the chip IC. In other words, the flexible circuit board 13 is separated from the base plate 12. It should be understood that, by stacking the flexible circuit board 13 on the second substrate 10 via the base plate 12, the connection strength between the flexible circuit board 13 and the second substrate 10 can be increased. By disposing the base plate 12 separate from the flexible circuit board 13, it can facilitate replacement of parts and components. An adhesive layer may be disposed between the flexible circuit board 13 and the base plate 12 to connect them.

Moreover, the display panel provided by the present embodiment also includes: a first polarizer 14 disposed on the surface of the first substrate 11 which is away from the second substrate 10 (i.e. the display surface of the display panel), a second polarizer 15 disposed on the surface of the second substrate 10 which is away from the first substrate 11 (i.e. the surface facing the back light source of the display device), a spacer 16 disposed between the second substrate 10 and the first substrate 11 and liquid crystal molecules (not shown in the figures) filled between the second substrate 10 and the first substrate 11. That is, the display panel provided by the present embodiment may be a liquid display panel.

Of course, in practical application, the display panel provided by the embodiments of the present disclosure is not limited to a liquid display panel, but may be a display panel of other types, such as an organic light emitting display panel.

Third Embodiment

Figure 3:
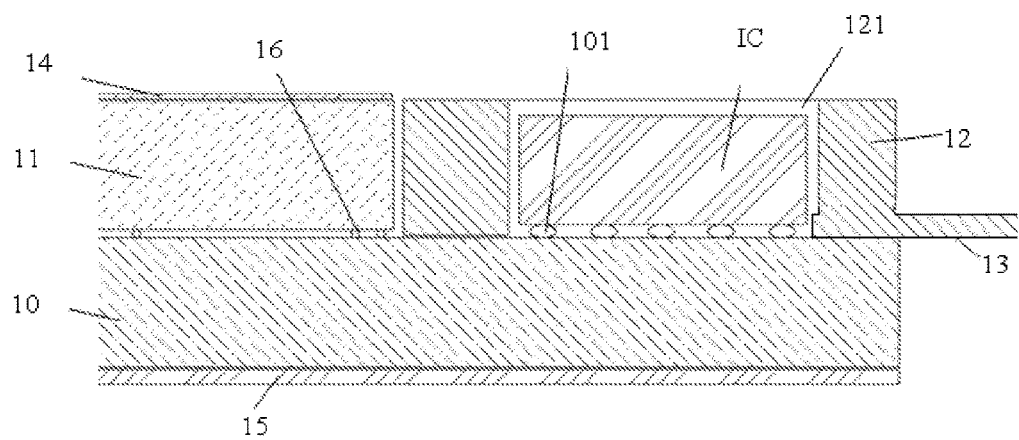
FIG. 3 is a cross sectional view of a display panel provided by a third embodiment of the present disclosure.

FIG. 3 is a cross sectional view of a display panel provided by a third embodiment of the present disclosure. Referring to FIG. 3, the display panel provided by the present embodiment is similar to the display panel provided by the second embodiment, and similarly includes: a second substrate 10, a first substrate 11, a base plate 12, a chip IC, a flexible circuit board 13, a first polarizer 14, a second polarizer 15, a spacer 16 and liquid crystal molecules (not shown in the figures). Since the structure of these components and position relationships between these components have been described in detail in the first embodiment, which will not be repeated herein.

In the following, only the difference between the present embodiment and the second embodiment will be described.

Specifically, in the present embodiment, the flexible circuit board 13 and the base plate 12 are of an integral structure. Thus, by stacking the flexible circuit board 13 on the second substrate 10 via the base plate 12, the connection strength between the flexible circuit board 13 and the second substrate 10 can be increased. By providing the base plate 12 and the flexible circuit board 13 as an integral structure, it can facilitate the assembly of the display panel.

Fourth Embodiment

Figure 4:
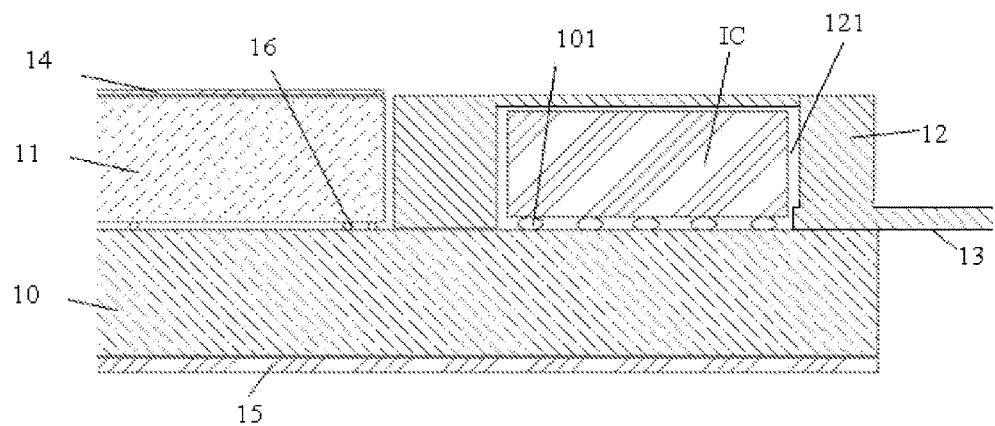
FIG. 4 is a cross sectional view of a display panel provided by a fourth embodiment of the present disclosure.

FIG. 4 is a cross sectional view of a display panel provided by a fourth embodiment of the present disclosure. Referring to FIG. 4, the display panel provided by the present embodiment is similar to the display panel provided by the third embodiment, and similarly includes: a second substrate 10, a first substrate 11, a base plate 12, a chip IC, a flexible circuit board 13, a first polarizer 14, a second polarizer 15, a spacer 16 and liquid crystal molecules (not shown in the figures). Since the structure and position relationship of these components have been described in detail in the first embodiment, which will not be repeated herein.

In the following, only the difference between the present embodiment and the third embodiment will be described. Specifically, no opening is disposed on the side of the base plate 12 which corresponds to the chip IC and is away from the substrate 10. That is, the receiving portion 121 of the base plate 12 is an opening recess disposed on the side of the base plate 12 which is approximate to the display region of the display panel and approximate to the second substrate 10. Compared with the receiving portion 121 in the first to the third embodiments, the receiving portion 121 of the present embodiment can further protect the upper surface of the chip IC.

It should be noted that, the various technical features in the above embodiments can be combined in any manner to form a new embodiment without contradiction.

Fifth Embodiment

Figure 5:
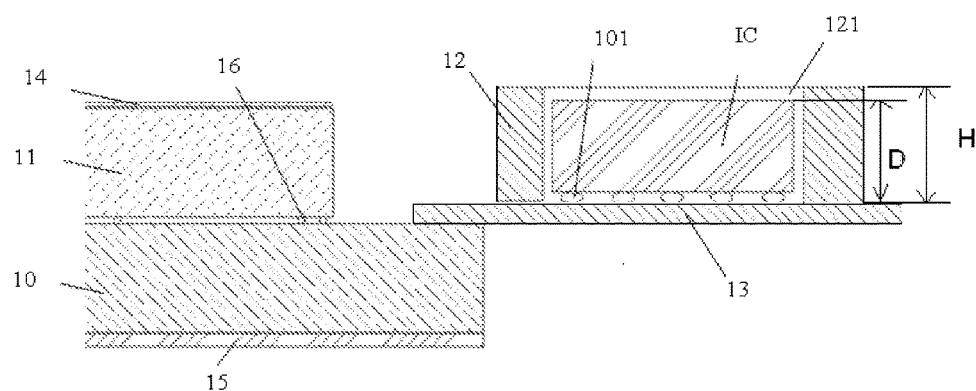
FIG. 5 is a cross sectional view of a display panel provided by a fifth embodiment of the present disclosure.

FIG. 5 is a cross sectional view of a display panel provided by a fifth embodiment of the present disclosure. Referring to FIG. 5, the display panel provided by the present embodiment includes: a second substrate 10, a first substrate 11, a base plate 12, a chip IC, a flexible circuit board 13, a first polarizer 14, a second polarizer 15, a spacer 16 and liquid crystal molecules (not shown in the figures). The second substrate 10 and the first substrate 11 are formed into a cell assembly. The flexible circuit board 13 is disposed on the second substrate 10 and is electrically connected to the second substrate 10. A chip mounting region is disposed on the flexible circuit board 13. The base plate 12 is disposed in the chip mounting region of the flexible circuit board 13 and has a receiving portion 12. The chip IC is disposed within the receiving portion 121 and is electrically connected to the flexible circuit board 13 via an electric connection point 101.

It should be understood that, in the display panel provided in the present embodiment, by means of the base plate 12 having the receiving portion 121, it can be mitigated or avoided the force that causes the chip IC to move or to be damaged, so as to protect the chip IC and improve the quality of the display panel and the display device.

In the present embodiment, optionally, the upper surface (i.e. the surface away from the flexible circuit board 13) of the base plate 12 is not lower than the upper surface (i.e. the surface away from the flexible circuit board 13) of the chip IC. That is, a distance from the surface of the base plate 12 which is away from the flexible circuit board 13 to the surface of the flexible circuit board 13 which is proximate to the base plate 12 is not smaller than a distance from the surface of the chip IC which is away from the flexible circuit board 13 to the surface of the flexible circuit board 13 which is proximate to the chip IC. Specifically, the receiving portion 121 of the base plate 12 may be a through hole penetrating the base plate 12. The shape of the through hole is similar to the shape of the chip IC, and the size of the through hole is not smaller than the size of the chip IC. The chip IC is disposed within the through hole. The depth H of the through hole (i.e. the receiving portion 121) is not smaller than the thickness D of the chip IC (including the thickness of the electric connection point 101), such that the chip IC is completely located within the receiving portion 121, to protect the chip IC. In this case, during the assembling process of the display panel and the display device, the base plate 12 can further protect the upper portion of the chip IC from damaging. Moreover, by providing the base plate 12 and the chip IC on the flexible circuit board 13, and then mounting the flexible circuit board 13 on the second substrate 10, it can avoid stress mark to be generated on the second substrate 10, and thus the display effect of the display panel and the display device will not be affected.

In the present embodiment, the base plate 12 may be made of (but not limited to) polycarbonate (i.e. PC material) or glass material.

In the present embodiment, the side of the base plate 12 which is approximate to the display region of the display panel is disposed to have an opening. That is, the receiving portion 121 on the base plate 12 is an opening recess disposed on the side of the base plate 12 which is approximate to the display region of the display panel, as shown in the second embodiment and the third embodiment. Additionally or alternatively, the receiving portion 121 of the base plate 12 is an opening recess disposed on the side of the base plate 12 which is approximate to the display region of the display panel and is approximate to the flexible circuit board 13, as shown in the fourth embodiment.

Further, in one embodiment, the flexible circuit board 13 and the base plate 12 may be of an integral structure. In this case, the side of the base plate 12 which corresponds to the chip IC and is away from the flexible circuit board 13 is an opening through which the chip IC may be mounted into the receiving portion 121.

It should be noted that, the structure and position relationships of the first polarizer 14, the second polarizer 15, the spacer 16 and liquid crystal molecules (not shown in the figures) have been described as shown in the second embodiment, which will not be repeated herein.

It should also be noted that, the display panel provided by the present embodiment is not limited to a liquid display panel, but may be a display panel of other types, such as an organic light emitting display panel.

It is to be understood that the above embodiments are merely illustrative embodiments for the purpose of illustrating the principles of the present disclosure, but the present disclosure is not limited thereto. It will be apparent to those skilled in the art that various changes and modifications can be made therein without departing from the spirit and essence of the present disclosure, which are also within the scope of the present disclosure.

What is claimed is:

1. A display panel, comprising:
a first substrate;
a second substrate, comprising a region overlapping with the first substrate and a region non-overlapping with the first substrate, a chip mounting region being disposed in the non-overlapping region;
a base plate, disposed within the chip mounting region and having a receiving portion; and a chip, disposed within the receiving portion of the base plate and electrically connected to the second substrate,
wherein a surface of the base plate in contact with the second substrate is a light reflective surface.

2. The display panel of claim 1, wherein a distance from a surface of the base plate away from the second substrate to a surface of the second substrate proximate to the base plate is not smaller than a distance from a surface of the chip away from the second substrate to a surface of the second substrate proximate to the chip.

3. The display panel of claim 1, further comprising a flexible circuit board electrically connected to the chip, wherein the flexible circuit board is disposed between the second substrate and the base plate and at least partly overlaps with the base plate.

4. The display panel of claim 3, wherein an adhesive layer is disposed between the flexible circuit board and the base plate.

5. The display panel of claim 3, wherein the flexible circuit board and the base plate are of an integral structure, and the base plate is made of polycarbonate or glass material.

6. The display panel of claim 1, wherein a side of the receiving portion proximate to a display region of the display panel is disposed to have an opening.

7. The display panel of claim 1, wherein a side of the receiving portion corresponding to the chip and away from the second substrate is disposed to have an opening.

8. The display panel of claim 1, wherein one opening is disposed in both a side of the receiving portion proximate to a display region of the display panel and a side of the receiving portion corresponding to the chip and away from the second substrate.

9. The display panel of claim 1, further comprising:
a first polarizer, disposed on a surface of the first substrate away from the second substrate; a second polarizer, disposed on a surface of the second substrate away from the first substrate; and
a spacer and liquid crystal molecules, disposed between the first substrate and the second substrate.

10. The display panel of claim 9, wherein the surface of the first substrate away from the second substrate is a display surface of the display panel, and the surface of the second substrate away from the first substrate is a surface facing a back light source.

11. A display device, comprising the display panel of claim 1.

12. A display panel, comprising a substrate, a chip and a flexible circuit board, the flexible circuit board being disposed on the substrate and electrically connected to the substrate, and a chip mounting region being disposed on the flexible circuit board, the display panel further comprising:
a base plate, disposed within the chip mounting region of the flexible circuit board and having a receiving portion, the chip being disposed within the receiving portion and electrically connected to the flexible circuit board,
wherein a surface of the base plate in contact with the substrate is a light reflective surface.

13. The display panel of claim 12, wherein a distance from a surface of the base plate away from the flexible circuit board to a surface of the flexible circuit board proximate to the base plate is not smaller than a distance from a surface of the chip away from the flexible circuit board to a surface of the flexible circuit board proximate to the chip.

14. The display panel of claim 12, wherein a side of the receiving portion proximate to a display region of the display panel is disposed to have an opening.

15. The display panel of claim 12, wherein a side of the receiving portion corresponding to the chip and away from the flexible circuit board is disposed to have an opening.

16. The display panel of claim 12, wherein one opening is disposed in both a side of the receiving portion proximate to a display region of the display panel and a side of the receiving portion corresponding to the chip and away from the substrate.

17. The display panel of claim 12, wherein the flexible circuit board and the base plate are of an integral structure, and the base plate is made of polycarbonate or glass material.

18. The display panel of claim 12, further comprising: an additional substrate fowled into a cell assembly with the substrate, a first polarizer disposed on a surface of the additional substrate away from the substrate, a second polarizer disposed on a surface of the substrate away from the additional substrate, a spacer disposed between the additional substrate and the substrate, and liquid crystal molecules filled between the additional substrate and the substrate.

19. The display panel of claim 18, wherein the surface of the additional substrate away from the second surface is a display surface of the display panel and the surface of the substrate away from the additional substrate is a surface facing a back light source.

* * * * *